(12) United States Patent
Matsuoka et al.

(10) Patent No.: US 9,379,276 B2
(45) Date of Patent: Jun. 28, 2016

(54) OPTICAL INTERCONNECTION MODULE AND OPTICAL-ELECTRICAL HYBRID BOARD

(71) Applicant: HITACHI, LTD., Tokyo (JP)

(72) Inventors: Yasunobu Matsuoka, Hachioji (JP); Toshiki Sugawara, Kokubunji (JP); Tatemi Ido, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/588,432

(22) Filed: Jan. 1, 2015

(65) Prior Publication Data

US 2015/0155423 A1  Jun. 4, 2015

Related U.S. Application Data

(62) Division of application No. 13/370,773, filed on Feb. 10, 2012, now abandoned.

(30) Foreign Application Priority Data

Mar. 29, 2011  (JP) .................................. 2011-071261

(51) Int. Cl.
*G02B 6/12* (2006.01)
*H01L 31/18* (2006.01)
(Continued)

(52) U.S. Cl.
CPC .............. *H01L 31/1808* (2013.01); *G02B 6/42* (2013.01); *G02B 6/4259* (2013.01); *G02B 6/43* (2013.01);
(Continued)

(58) Field of Classification Search
CPC ........ G02B 6/42; G02B 6/12; G02B 6/12019; G02B 6/3598; G02B 6/4245
See application file for complete search history.

(56) References Cited

U.S. PATENT DOCUMENTS 6,343,171 B1 * 1/2002 Yoshimura et al. ............. 385/50
6,985,659 B2 * 1/2006 Torigoe ................ G02B 6/4201
385/114
(Continued)

FOREIGN PATENT DOCUMENTS

JP  2002-182048 A  6/2002
JP  2002-189137 A  7/2002
(Continued)

OTHER PUBLICATIONS

Office Action issued Mar. 26, 2013, in Japanese Patent Application No. 2011-071261.
(Continued)

*Primary Examiner* — Michelle R Connelly
*Assistant Examiner* — Hoang Tran
(74) *Attorney, Agent, or Firm* — Miles & Stockbridge P.C.

(57) ABSTRACT

There are provided an optical interconnection module and an optical-electrical hybrid board using the same to process optical and electric signals on a board at a low transmission loss at high speed in transmitting high-speed optical signals sent and received between chips or between boards in a data processing apparatus. An optical interconnection module has a structure in which an optical signal is emitted from a laser optical source device, propagates the inside of a modulator device, and is deflected by a beam turning structure in the vertical direction of a substrate, an optical signal is incident from the outside of a semiconductor substrate, and transmitted and received at a photo diode provided on the semiconductor substrate, and the optical signals are optically connected to each other through the inside of the semiconductor substrate in the vertical direction of the substrate with the outside of the semiconductor substrate.

11 Claims, 10 Drawing Sheets

(51) Int. Cl.
*G02B 6/42* (2006.01)
*G02B 6/43* (2006.01)
*H01L 31/0232* (2014.01)
*H01L 31/167* (2006.01)
*H01L 25/16* (2006.01)

(52) U.S. Cl.
CPC ........ *H01L 31/02325* (2013.01); *H01L 31/167* (2013.01); *G02B 6/12002* (2013.01); *G02B 6/4206* (2013.01); *G02B 6/4214* (2013.01); *G02B 6/4279* (2013.01); *G02B 2006/12142* (2013.01); *H01L 25/167* (2013.01); *H01L 2224/16225* (2013.01); *H01L 2924/15311* (2013.01)

(56) References Cited

U.S. PATENT DOCUMENTS

| | | | |
|---|---|---|---|
| 7,200,293 | B2 | 4/2007 | Iwasaki |
| 2003/0109142 | A1* | 6/2003 | Cable et al. ................. 438/708 |
| 2010/0044828 | A1* | 2/2010 | Suh ....................... H01L 27/144 257/506 |
| 2010/0215313 | A1 | 8/2010 | Matsuoka et al. |
| 2010/0301445 | A1* | 12/2010 | Mazzillo ...................... 257/450 |
| 2011/0163404 | A1 | 7/2011 | Lee et al. |

FOREIGN PATENT DOCUMENTS

| | | |
|---|---|---|
| JP | 2004-117582 A | 4/2004 |
| JP | 2004-235182 A | 8/2004 |
| JP | 2004-317717 A | 11/2004 |
| JP | 2005-085844 A | 3/2005 |
| JP | 2007-156114 A | 6/2007 |
| JP | 2008-294226 A | 12/2008 |
| JP | 2010-191365 A | 9/2010 |
| JP | 2011-039442 A | 2/2011 |
| JP | 2013-504212 A | 2/2013 |
| WO | WO 2011/028865 A2 | 3/2011 |

OTHER PUBLICATIONS

English translation of Office Action dated Dec. 3, 2013, in Japanese Patent Application No. 2011-071261.

* cited by examiner

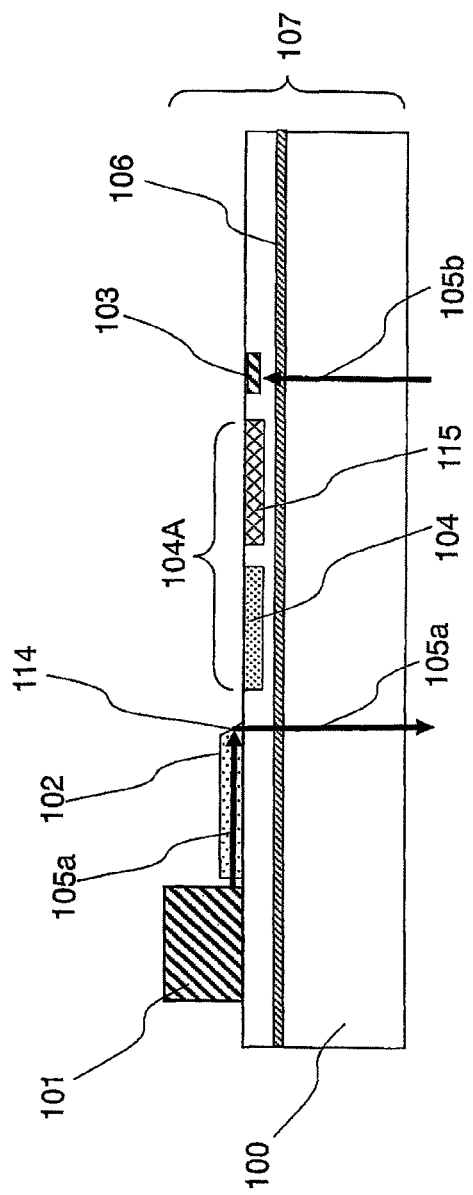

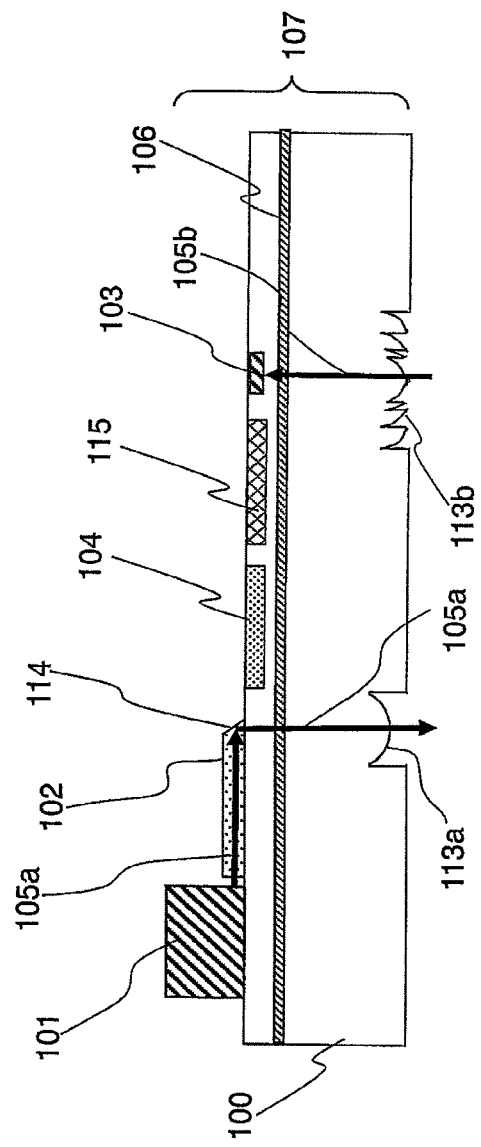

OPTICAL INTERCONNECTION MODULE AND OPTICAL-ELECTRICAL HYBRID BOARD

CLAIM OF PRIORITY

The present application claims priority from Japanese Patent Application JP2011-071261 filed on Mar. 29, 2011, the content of which is hereby incorporated by reference into this application.

BACKGROUND OF THE INVENTION

1. Field of the Invention

The present invention relates to an optical interconnection module to be a transmitter/receiver in transmitting high-speed optical signals sent and received between chips or boards of a rack and chips or boards of another rack or between chips or boards in a rack such as a data processing apparatus, and an optical-electrical hybrid board that processes optical and electric signals on the board using the same.

2. Description of the Related Arts

In these years, in the field of information and telecommunications, the traffic of information and telecommunications for optically transmitting and receiving large-capacity data at high speed is being improved rapidly. Optical fiber networks are developed for a relatively long distance of a few kilometers or more on the backbone network, metropolitan network, and access network. In future, it is effective to replace signal wiring with optical fibers also for an very short distance such as an inter-rack distance (ranging from a few to a few hundred meters) or intra-rack distance (ranging from a few to a few ten centimeters) of IT equipments such as a router and a server, in order to process large-capacity data without delay.

As for the replacement of inter-rack/intra-rack wiring with optical fibers, in transmission equipments such as a router and a switch, for example, high-frequency signals transmitted from the outside such as Ethernet through optical fibers are inputted to a circuit board called a line card. This line card is formed of a few line cards for a single backplane. The signals inputted to the line cards are aggregate to a circuit board called a switch card through the backplane, processed at an LSI in the inside of the switch card, and outputted to the line cards again through the backplane. Here, in the current equipments, signals at a terabit per second or more are aggregate from the line cards to the switch card through the backplane in the existing conditions. In order to send the signals through the current electric wiring, it is necessary to split the signals into signals at about 1 to 8 gigabits per second for a single wire because of propagation loss. Thus, a hundred wires or more are necessary.

Furthermore, it is necessary to provide an equalizer for these high-frequency lines and to take measures against reflection or crosstalk between wires. In future, if system capacity is increased as in a device that processes information at a terabit per second or more, problems such as the number of wires and the measures against crosstalk become severe more and more in conventional electric wiring. To cope these issues, signal transmission lines between boards of the intra-rack line card through the backplane to the switch card and signal transmission lines between chips in a board are replaced with optical fibers, so that high-frequency signals at 10 gigabits per second or more can be propagated at a low transmission loss. Thus, the replacement of signal transmission lines with optical fibers is promising because the number of wires is small and the measures are unnecessary also for high-frequency signals. In addition to the router and the switch, also in video equipment such as a video camera and consumer electronics such as a personal computer and a mobile telephone, an increase in the speed and capacity of video signal transmission between a monitor and a terminal is demanded as well as problems of taking measures against signal delay and noise become noticeable in conventional electric wiring, for future high-definition images. Thus, the replacement of signal transmission lines with optical fibers is effective.

In order to implement such a high-speed optical interconnection circuit and to apply the circuit to inter-rack/intra-rack transmission, an optical module and a circuit are necessary, which are excellent in performance, downsizing, integration, and component packaging properties with inexpensive fabrication instruments. Therefore, a downsized, high-speed optical module is proposed in which an optical waveguide is used for a wiring medium, which is more inexpensive than a conventional optical fiber and advantageous in densification, and optical components and the optical waveguide are integrated on a substrate. As for the interconnection transmission rate, it is expected that high-speed modules operating at 25 gigabits per second/ch or 40 gigabits per second/ch will be necessary in future, from optical modules currently operating based on 10 gigabits per second/ch. Concerning this, the mainstream of optical sources directed to optical interconnection modules is direct modulation currently represented by surface emitting lasers (Vertical-Cavity Surface-Emitting Laser: VCSEL) or the like. However, since it is expected that a transmission rate of 25 gigabits per second/ch or more described above is a limit of direct modulation, it can be considered that an optical module using an optical source according to external modulation will be one of approaches for increasing speed in future.

As for a conventional method for the optical interconnection module, Japanese Patent Application Laid-Open Publication No. 2008-294226 discloses a form of mounting an optical interconnection module in which an optical module having a laser diode array, a photo diode array, and an integrated circuit integrated thereon is mounted on an optical waveguide wiring board with solder bumps. In this example, in mounting the optical module on the optical waveguide wiring board, the laser diode array or the photo diode array and an optical waveguide are optically connected to each other in the vertical direction of the substrate, and at the same time, the optical module and the optical waveguide wiring board are electrically connected to each other.

SUMMARY OF THE INVENTION

According to the form of mounting the optical interconnection module disclosed in Japanese Patent Application Laid-Open Publication No. 2008-294226, a surface emitting laser diode such as a surface emitting laser (VCSEL) or a surface incident photo diode is mounted on the optical module. Namely, since a light emitting and receiving surface on which optical signals are transmitted and received and electrodes through which electric signals are transmitted and received are formed on the same surface on which the diodes are provided, a spatial optical distance between the diodes and the optical waveguide is increased because of wire bonding mounting. Thus, this causes an increase in the transmission loss of optical connection between the diodes and the optical waveguide due to optical beam expansion in the spatial gap. Particularly in a light receiver, since the light receiving diameter of the photo diode is reduced (a diameter of 20 μm or less) for an increase in the speed of the optical module (20 gigabits per second/ch or more) in future, the influence of an increase in the transmission loss of optical connection due to optical beam expansion is increasingly noticeable. In accordance with the advance of increasing the transmission rate in future as 25 gigabits per second/ch or 40 gigabits per second/ch, it is also expected to more clearly notice the limit of direct modulation represented by optical source devices and surface emitting lasers (VCSEL) or the like and the influence of electric signal deterioration affected by the inductance (L) in wire bonding mounting.

From the description above, it is an object of the present invention to provide an optical interconnection module excellent in increasing the transmission rate, downsizing, integration, and component packaging properties with inexpensive fabrication instruments in transmitting high-speed optical signals sent and received between chips or boards of a rack and chips or boards of another rack or between chips or boards in a rack such as a data processing apparatus, and an optical-electrical hybrid board that processes optical and electric signals on the board using the same at a low transmission loss at high speed.

In order to achieve the object, the main configuration of an optical interconnection module according to the present invention is as follows.

An optical interconnection module includes: an optical source device mounted on a semiconductor substrate and configured to emit light; a modulator device including: a waveguide integrated on the semiconductor substrate and configured to guide the light in a horizontal direction with respect to a front surface of the semiconductor substrate; and a beam turning configured to turn a direction of the light passing through the waveguide in a direction different from the horizontal direction; a photo diode configured to receive light incident from an outside of the semiconductor substrate; and a driver IC configured to drive diodes including the photo diode, wherein the light having passed through the beam turning enters one main surface of the semiconductor substrate, passes through the semiconductor substrate, and is emitted from the other main surface opposite the one surface to the outside of the semiconductor substrate.

The main configuration of an optical-electrical hybrid board according to the present invention is as follows.

An optical-electrical hybrid board has the aforementioned optical interconnection module mounted thereon, the optical-electrical hybrid board including: an optical wiring board including: a clad layer provided on a substrate; a waveguide core covered by a material having a refractive index higher than a refractive index of the clad layer; and an optical waveguide having a beam turning mirror structure at an end portion of the waveguide core, wherein: the optical interconnection module is mounted on the optical wiring board; and signals sent and received between a laser device and an external modulator provided on the optical interconnection module and the optical waveguide, or between the optical waveguide and a photo diode are optically connected through a silicon substrate in a vertical direction of the substrate.

According to an aspect of the present invention, it is possible to obtain an optical interconnection module that integrally transmits and receives signals at high speed in which diodes and a drive circuit are mounted on a single Si chip in high density and an optical modulator and photo diodes are monolithic integrated. Furthermore, it is possible to provide an optical-electrical hybrid board in which the optical interconnection module according to the present invention is mounted on a substrate provided with an optical waveguide having a beam turning mirror structure for highly efficiently optically connecting signals sent and received between the diodes and the optical waveguide through the Si substrate.

BRIEF DESCRIPTION OF THE DRAWINGS

The present invention will become fully understood from the detailed description given hereinafter and the accompanying drawings, wherein:

FIG. 1A is a cross sectional view illustrating an optical interconnection module according to a first embodiment of the present invention;

FIG. 2 is a cross sectional view illustrating an optical interconnection module according to a second embodiment of the present invention;

DETAILED DESCRIPTION OF THE PREFERRED EMBODIMENTS

In the following, embodiments of the present invention will be described in detail with reference to the drawings.

First Embodiment

Figure 1B:
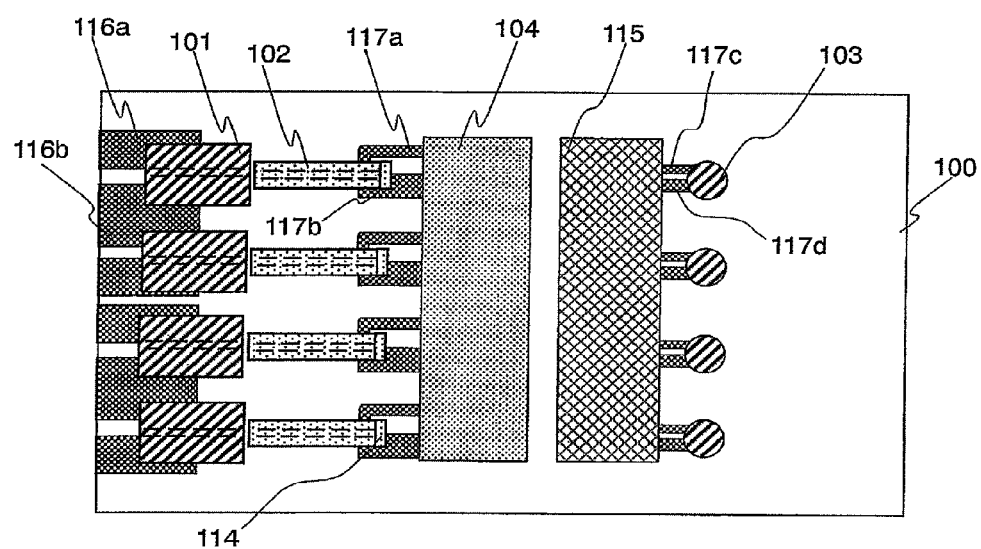
FIG. 1B is a top view illustrating the optical interconnection module according to the first embodiment of the present invention.

FIGS. 1A and 1B are a cross sectional view and a top view illustrating the outline of an optical interconnection module according to a first embodiment of the present invention. As shown in FIG. 1A, this embodiment includes a semiconductor substrate 100 such as an SOI (Silicon-Oxide-Insulator) substrate made of an Si material, a laser optical source device 101 formed on the semiconductor substrate 100, and a modulator device 102 optically connected to the optical source device 101 and formed of an Si waveguide in the horizontal direction of the substrate. Here, a beam turning part 114 is provided at the optical output end of the modulator device 102, having the tip end portion of the Si waveguide tapered at an angle of 45 degrees, so that a structure is provided in which a beam propagating the inside of the Si waveguide in the horizontal direction of the substrate is deflected downward in the vertical direction of the substrate at an angle of 90 degrees.

In this embodiment, as an example, the case is shown where the tapered angle of the tip end portion of the Si waveguide is an angle of 45 degrees. However, generally, it is assumed that variations in processing accuracy are plus/minus about ten degrees. Thus, the actual finished tapered angle is finished within a range of angles from 35 to 55 degrees in the case where the designed tapered angle is an angle of 45 degrees.

It can be considered that the optical path or characteristics of an emitted beam or an incident beam are not affected if the tapered angle is within this range. A photo diode 103 and a driver IC 104A are monolithic integrated on the same semiconductor substrate 100. The driver IC 104A is formed of a driver circuit 104 that drives the modulator device 102 and a trans impedance amplifier 115 that amplifies output electric signals from the photo diode 103.

FIG. 1B shows bias power supply lines 116a and 116b and high-frequency electric lines 117a to 117d, which are not shown in FIG. 1A. Thus, it is assumed that electrical wiring is provided also in FIG. 1A as similar to that in FIG. 1B.

According to this structure, a beam 105a emitted from the laser optical source device 101 is optically connected to the modulator device 102, and modulated at high speed in propagating the inside of the Si waveguide in the horizontal direction of the substrate. At this time, the modulator device 102 is electrically connected to the driver circuit 104 integrated on the same semiconductor substrate 100, and a high-frequency signal from the driver circuit 104 is inputted to the modulator device 102. The modulated beam propagating the inside of the Si waveguide is deflected downward in the vertical direction of the substrate at an angle of 90 degrees by the beam tuner 114 at the tip end of the waveguide, passes through the inside of the Si semiconductor substrate 100, and is emitted to the outside of the substrate.

Similarly, an optical signal incident from the outside below the substrate toward the upper part in the vertical direction of the substrate passes through the inside of the Si semiconductor substrate 100, and the signal is optically connected to the photo diode 103 and converted into an electric signal. The signal is then outputted through the transimpedance amplifier 115 integrated on the same semiconductor substrate 100.

As described above, with this structure, an optical source having the laser optical source device 101 and the modulator device 102 integrated with each other is applied, so that it is possible to perform high speed optical signal transmission at 20 gigabits per second or more as compared with direct modulation laser devices frequently used as optical devices for optical communications or optical interconnections. As shown in FIG. 1A, the modulator device 102, the photo diode 103, and the driver IC 104A (104 and 115) are integrated on a single chip in a monolithic manner, so that it is possible to collectively fabricate the optical devices and the circuit by Si wafer processing, and it is possible to implement an inexpensive optical interconnection module downscaled to chip size.

A laser device fabricated on a substrate using a compound semiconductor material such as indium phosphorous (InP) or the like is used for the laser optical source device 101 placed on the Si semiconductor substrate 100. Since this optical interconnection module is formed of the substrate using an Si material and the modulator device, the emission wavelength of the laser optical source device 101 is set to an infrared wavelength range of 1 µm or more in order to avoid a problem of Si optical absorption. Similarly, the photo diode 103 formed on the Si semiconductor substrate 100 has absorption sensitivity in the receiver at an infrared wavelength range of 1 µm or more as described above, and the photo diode 103 is formed using a germanium (Ge) material that can be fabricated by Si wafer processing. Here, the reason why a Ge material is used is to improve absorption sensitivity in the infrared wavelength range, of course, in consideration that the range of optical wavelengths used in the present invention is 1 µm or more.

FIG. 1B shows a top view illustrating the optical interconnection module according to the first embodiment of the present invention. As shown in FIG. 1B, the laser optical source device 101, the modulator device 102, the photo diode 103, and the driver IC 104A (104 and 115) placed on the Si semiconductor substrate 100 form an array with two channels or more (here, the case of four channels is shown).

In the configuration shown in FIG. 1B, the array of the modulator devices 102 and the array of the photo diodes 103 are disposed at positions faced to each other on the semiconductor substrate 100, and the driver circuit 104 and the trans impedance amplifier 115 are disposed between the array of the modulator devices 102 and the array of the photo diodes 103.

The bias power supply lines 116a and 116b for power supply, a ground (GND), or the like to drive the laser optical source device 101 are formed on the back side of the semiconductor substrate 100 opposite the light emitting surface of the laser optical source device 101. The high-frequency electric lines 117a, 117b, 117c, and 117d connecting the array of the modulator devices 102 to the driver circuit 104 and connecting the array of the photo diodes 103 to the transimpedance amplifier 115 are also formed on the semiconductor substrate 100.

As shown in FIG. 1B, it is revealed that the bias power supply lines 116a and 116b are lead out on the left side of FIG. 1B, and the high-frequency electric lines 117a, 117b, 117c, and 117d are lead out on the right side. This is because the lines are disposed in consideration that high-frequency electrical fluctuations do not cause interference as noise with the bias power supply lines. Preferably, the high-frequency electric lines and the power supply lines are provided apart from each other as far as possible and in different directions, not provided in parallel with each other.

With the aforementioned configuration, the modulator device 102, the photo diode 103, and the driver IC 104A (104 and 115) are monolithic integrated on a single Si chip in the form of a multichannel array, so that it is possible to implement a downsized optical interconnection module capable of transmitting large-capacity signals in high density.

Second Embodiment

FIG. 2 is a cross sectional view illustrating an optical interconnection module according to a second embodiment of the present invention. In this embodiment, such a structure is formed in which a lens 113a is provided on an extension line drawn from a beam turning part 114 in the vertical direction of a substrate, and the lens 113a is provided on the substrate surface (the back surface) opposite the front surface of a semiconductor substrate 100, on which the beam turning part 114 provided at the front end of a modulator device 102 is formed.

With this structure, a modulated beam propagating the inside of an Si waveguide is deflected downward in the vertical direction of the substrate at an angle of 90 degrees by the beam tuner 114 at the tip end of the waveguide, passes through the inside of the Si semiconductor substrate 100, and is emitted to the outside of the substrate. At this time, the expansion of the emitted beam to the outside of the substrate is suppressed or collected at the lens 113a provided on the back surface of the substrate, so that it is possible to provide highly efficient optical connection between this optical interconnection module and external optical wiring.

Similarly, also on the light receiving side, such a structure is formed in which a lens 113b is provided on an extension line drawn from a photo diode 103 in the vertical direction of the substrate, and the lens 113b is provided on the substrate surface (the back surface) opposite the front surface of the semiconductor substrate 100, on which the photo diode 103 is formed. Also with this structure, an incident beam from the outside of the substrate is collected at the lens 113b provided on the back surface of the substrate, and the beam is highly efficiently optically connected to the photo diode 103 on the front surface of the substrate. It is noted that the lens provided on the back surface of the Si semiconductor substrate 100 may be a spheric lens or an aspheric lens with a given curvature like the lens 113a on the optical source side, or may be a lens in a Fresnel lens shape like the lens 113b on the light receiving side.

Here, a lens in a Fresnel lens shape may be applied to the lens 113a on the optical source side in addition to a spheric lens or an aspheric lens, or a spheric lens or an aspheric lens may be applied to the lens 113b on the light receiving side in addition to a lens in a Fresnel lens shape. The same kind of lens described above may be used for both of the lens 113a on the optical source side and the lens 113b on the light receiving side.

Third Embodiment

FIGS. 3A to 3G are diagrams illustrating an exemplary method of fabricating an optical interconnection module according to a third embodiment of the present invention.

Figure 3A:
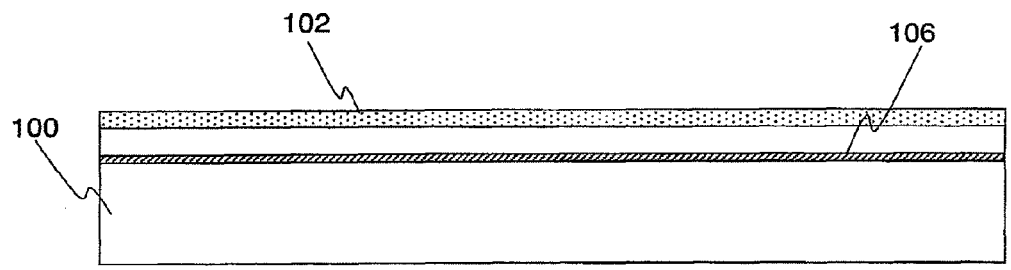
FIG. 3A is a diagram illustrating an exemplary method of fabricating an optical interconnection module according to a third embodiment of the present invention, in which a material layer forming a modulator device is formed on a semiconductor substrate.

First, as shown in FIG. 3A, a SOI substrate is prepared, in which an insulated layer (a silicon oxide layer) 106 and a semiconductor layer such as a silicon layer or the like are stacked on a semiconductor substrate 100, and a material layer 102' to form a modulator device 102 is formed on the SOI substrate.

Figure 3B:
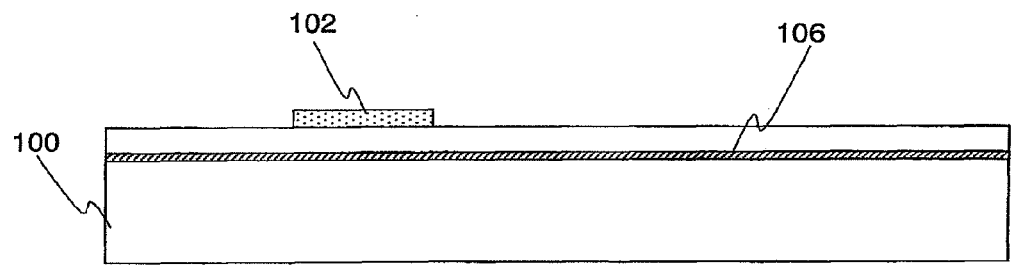
FIG. 3B is a diagram illustrating an exemplary method of fabricating the optical interconnection module according to the third embodiment of the present invention, in which the modulator device is formed on the semiconductor substrate.

Subsequently, as shown in FIG. 3B, the material layer 102' is patterned using a mask, and processed into the modulator device 102. Although a material and a fabrication method for the modulator device 102 are not mentioned particularly, the modulator device 102 can be fabricated using Si, $SiO_2$, SiN, or the like by epitaxial growth, spattering, or etching.

In this embodiment, an exemplary structure is shown in which the modulator device 102 is formed on the semiconductor substrate 100. However, such a structure may be possible in which the modulator device 102 is buried in the inside of the semiconductor substrate 100 so as not to protrude on the front surface of the semiconductor substrate, depending on the applications. For a fabrication method at this time, there is a method in which a groove is formed in the semiconductor substrate 100 and a material to form the modulator device is buried in the inside of the groove.

Figure 3C:
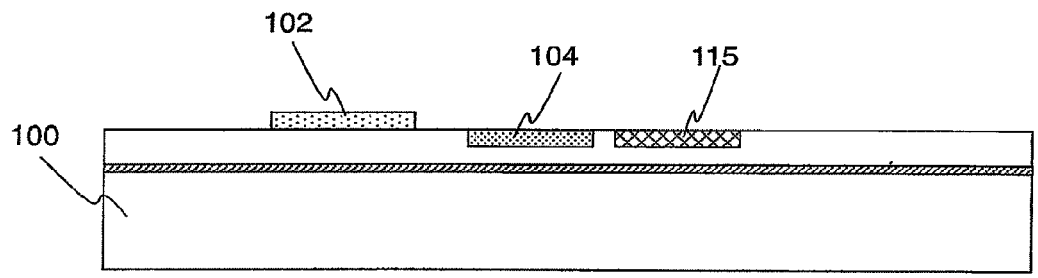
FIG. 3C is a diagram illustrating an exemplary method of fabricating the optical interconnection module according to the third embodiment of the present invention, in which a driver IC is formed on the semiconductor substrate.

Subsequently, as shown in FIG. 3C, a driver circuit 104 and a transimpedance amplifier 115 are formed near the modulator device 102 on the semiconductor substrate 100. At this time, the driver IC may be provided in the stage before metal wiring in consideration of wafer processing later.

Figure 3D:
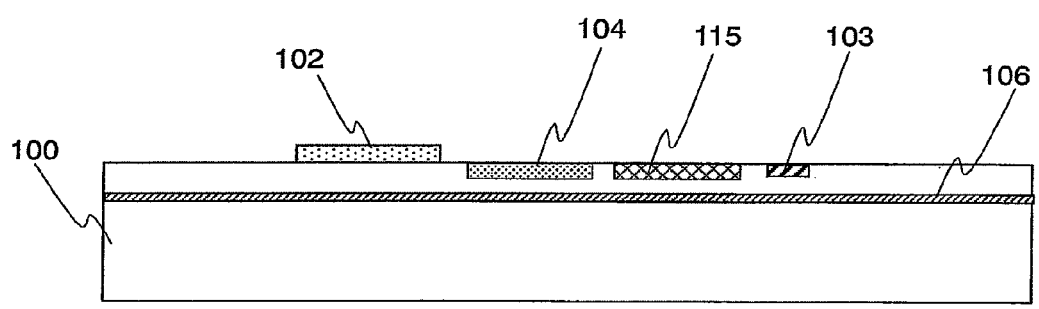
FIG. 3D is a diagram illustrating an exemplary method of fabricating the optical interconnection module according to the third embodiment of the present invention, in which a photo diode is formed on the semiconductor substrate.

Subsequently, as shown in FIG. 3D, a photo diode 103 is formed near the trans impedance amplifier 115 on the semiconductor substrate 100. Also at this time, the photo diode 103 can be integrally fabricated on the substrate using a germanium (Ge) material for the photo diode 103 by Si wafer processing such as epitaxial growth, as explained in the first embodiment.

In FIGS. 3C to 3D, the driver circuit 104, the trans impedance amplifier 115, or the photo diode 103 is formed in the inside of the semiconductor substrate 100 by forming a diffusion layer to form the circuit or device. However, such a configuration may be possible in which a thin film is deposited on the semiconductor substrate 100 and the film is patterned to form a diffusion layer for forming the circuit or device, depending on the applications.

Figure 3E:
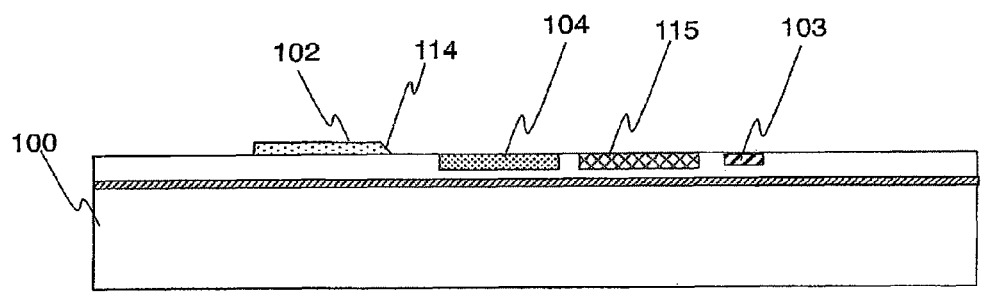
FIG. 3E is a diagram illustrating an exemplary method of fabricating the optical interconnection module according to the third embodiment of the present invention, in which a beam tuner is provided at the optical output end of the modulator device.

Subsequently, as shown in FIG. 3E, a beam tuner 114 having the tip end portion of an Si waveguide tapered at an angle of 45 degrees is provided at the optical output end of the modulator device 102, so that such a structure is formed in which a beam propagating the inside of the Si waveguide in the horizontal direction of the substrate is deflected downward in the vertical direction of the substrate at an angle of 90 degrees. For a fabrication method of the tapered part at an angle of 45 degrees, physical processing such as dry etching or dicing and anisotropic wet etching or the like can be used.

Figure 3F:
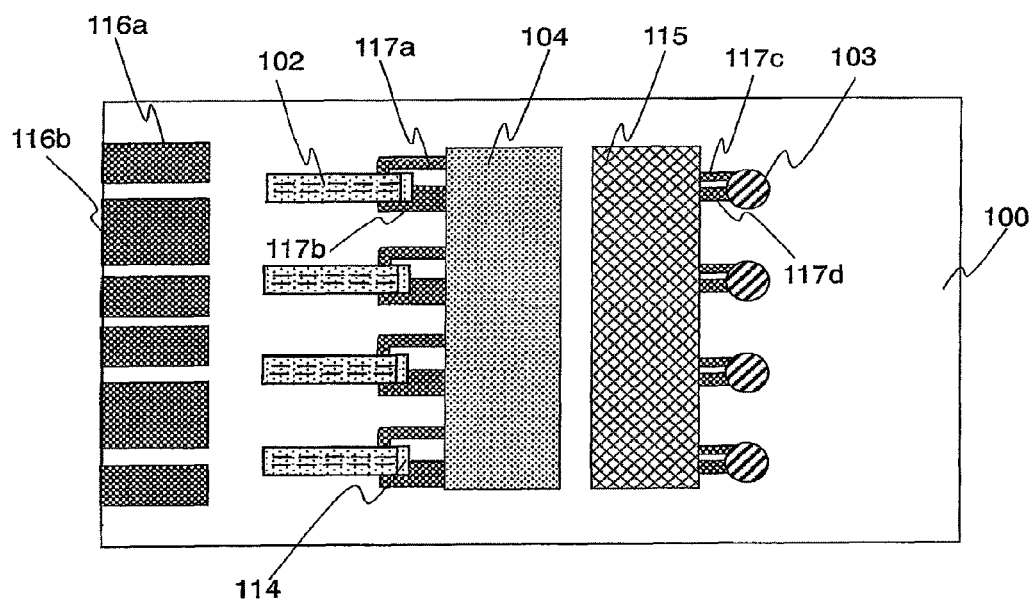
FIG. 3F is a diagram illustrating an exemplary method of fabricating the optical interconnection module according to the third embodiment of the present invention, in which bias power supply lines to drive a laser optical source device are formed.

Subsequently, as shown in FIG. 3F, bias power supply lines 116a and 116b for power supply, a ground (GND), or the like to drive a laser optical source device 101 are formed on the rear side of the semiconductor substrate 100 opposite the light emitting surface of the laser optical source device 101. High-frequency electric lines 117a, 117b, 117c, and 117d connecting the array of the modulator devices 102 to the driver circuit 104 and connecting the array of the photo diodes 103 to the trans impedance amplifier 115 may be formed on the semiconductor substrate 100 at the same time when forming the bias power supply lines 116a and 116b. Metal wiring processing for the driver IC 104A (104 and 115) may be performed at this time, if not performed yet.

Figure 3G:
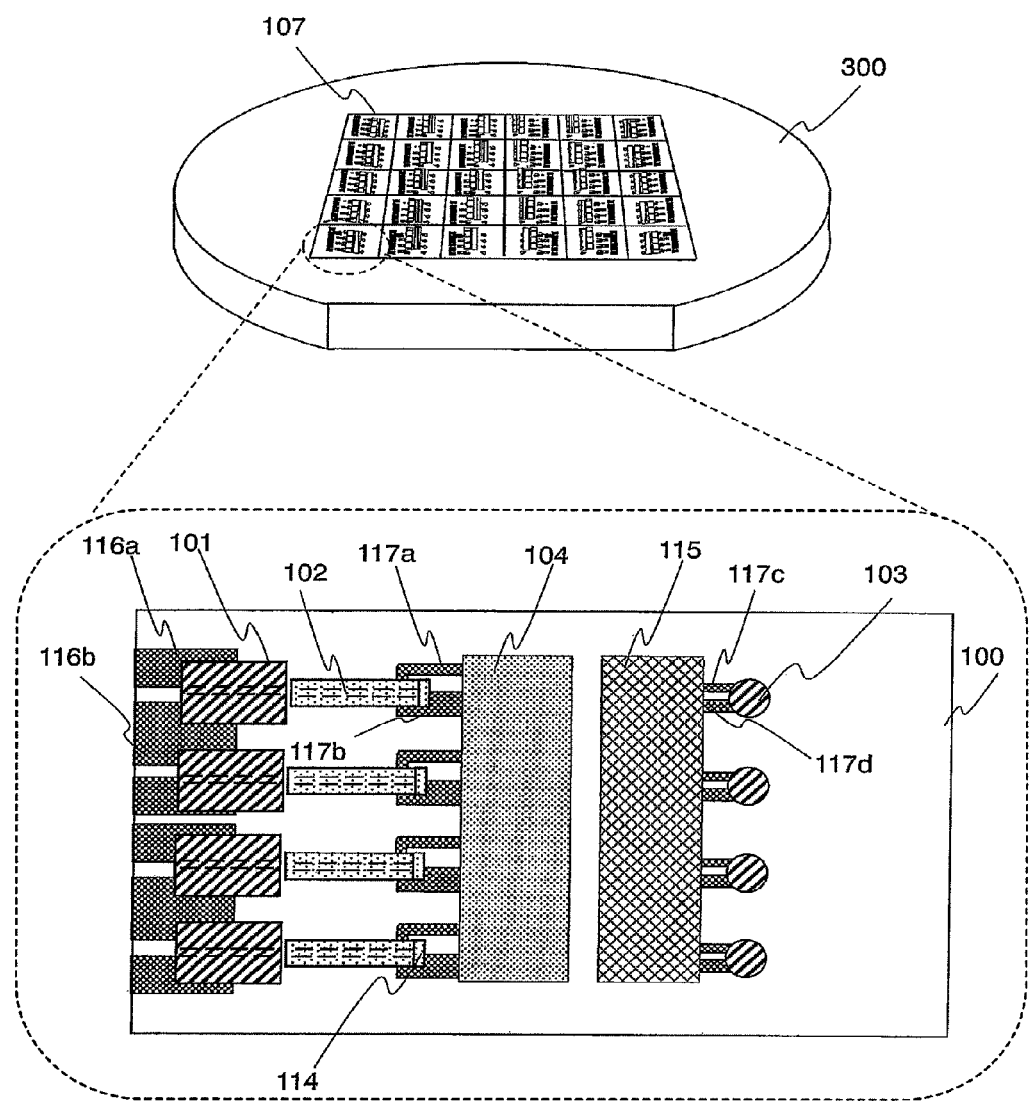
FIG. 3G is a diagram illustrating an exemplary method of fabricating the optical interconnection module according to the third embodiment of the present invention, in which the laser optical source device is mounted on the wiring pattern of the optical interconnection module.

Lastly, as shown in FIG. 3G, the laser optical source device 101 is mounted on each of a plurality of optical interconnection modules 107 in a wiring pattern arranged on an Si wafer 300, so that a module is completed. It is noted that such a scheme may be possible in which the laser optical source device 101 is mounted on the Si wafer 300 beforehand and the Si wafer 300 is then separated into chips in units of modules by cutting or the like, or in which the Si wafer is separated into chips in units of modules and the laser optical source device 101 is then mounted on the individual modules.

According to the process steps described in this embodiment, it is possible to collectively fabricate the optical devices and the circuit by Si wafer processing, and it is possible to implement an inexpensive optical interconnection module downscaled to chip size.

Fourth Embodiment

Figure 4:
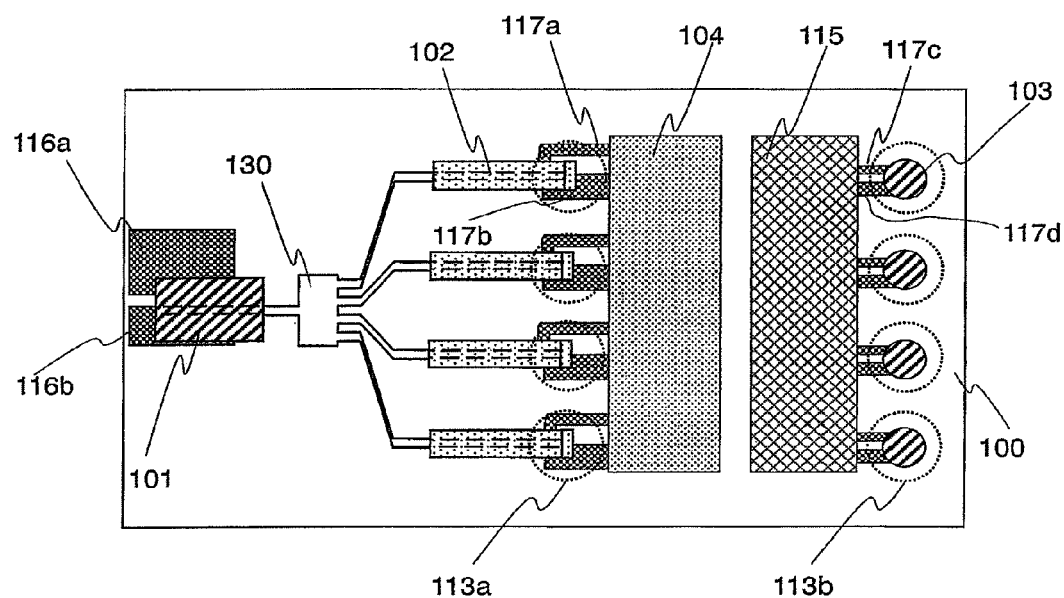
FIG. 4 is a top view illustrating an optical interconnection module according to a fourth embodiment of the present invention.

FIG. 4 is a top view illustrating an optical interconnection module according to a fourth embodiment of the present invention. In this embodiment, a modulator device 102, a photo diode 103, and a driver IC 104A (104 and 115) integrated on an Si semiconductor substrate 100 are formed in a four-channel array. An optical waveguide coupler 130 is provided between a laser optical source device 101 and the modulator device array 102, having a 1:N branch structure (N is a natural number of two or more, where N=4, that is, 1:4). Such an optical interconnection module is formed in which the laser optical source device 101 and the modulator device array 102 are optically connected to each other through the optical waveguide coupler 130. The optical waveguide coupler 130 can be fabricated using Si, similar to the modulator device 102, or using $SiO_2$, SiN, or the like by epitaxial growth, spattering, or etching. It is also effective to provide a structure of a spot-size converter to perform incident/emitted beam mode coupling at a low transmission loss in the optical connecting portion between the optical waveguide coupler 130 and the laser optical source device 101 or the modulator device array 102.

With this configuration, it is possible to reduce the number of parts and the number of mounting process steps for a reduction in costs, and it is possible to implement an optical interconnection module excellent in further downscaling chip size.

Fifth Embodiment

Figure 5:
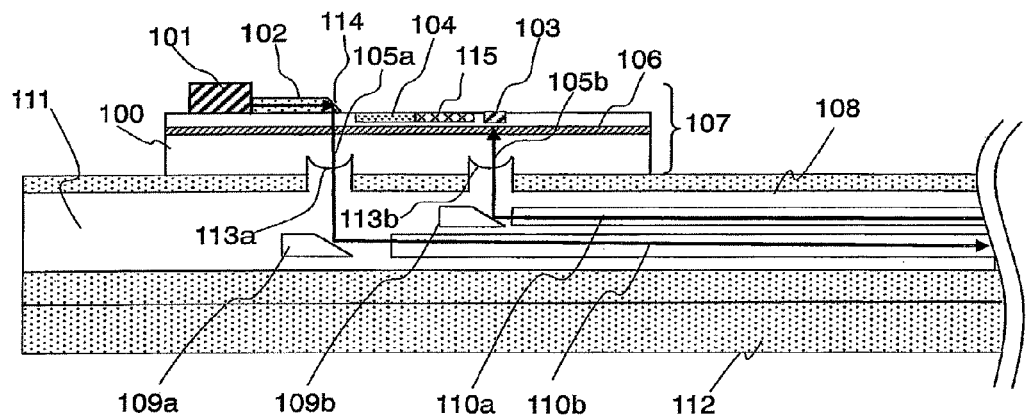
FIG. 5 is a cross sectional view illustrating an optical-electrical hybrid board according to a fifth embodiment of the present invention on which an optical interconnection module is mounted.

FIG. 5 is a cross sectional view illustrating an optical-electrical hybrid board according to a fifth embodiment of the present invention on which an optical interconnection module is mounted. In this embodiment, as shown in FIG. 5, an optical waveguide wiring board is provided on a substrate 112 made of glass epoxy or the like. The optical waveguide wiring board is formed of wiring cores 110a and 110b surrounded by a clad layer 111 and made of a material having a refractive index higher than that of the clad layer. Beam tuning mirrors 109a and 109b are placed at the end portions of the wiring cores 110a and 110b. According to this configuration, a beam 105a emitted from a laser optical source device 101 is optically connected to a modulator device 102, and modulated at high speed in propagating the inside of an Si waveguide in the horizontal direction of the substrate. After that, the modulated beam propagating the inside of the Si waveguide is deflected downward in the vertical direction of the substrate at an angle of 90 degrees by a beam tuner 114 at the tip end of the waveguide, passes through the inside of an Si semiconductor substrate 100, and is emitted to the outside of the substrate. The emitted beam 105a is collected at a lens 113a integrated on the Si semiconductor substrate 100, deflected by the beam turning mirror 109a provided in the inside of the optical waveguide wiring board in the horizontal direction of the substrate, and optically connected to the waveguide core 110b as well as propagates the inside of the core.

Similarly, an optical signal propagating the wiring core 110a in the inside of the optical waveguide wiring board is deflected by the beam turning mirror 109a in the vertical direction of the substrate, and enters the substrate 100 of an optical interconnection module 107. After that, the optical signal is collected at a lens 105b, and passes through the inside of the Si semiconductor substrate 100. The optical signal is optically connected to a photo diode 103 and converted into an electric signal, and the signal is then outputted through a transimpedance amplifier 115.

The wiring cores 110a and 110b and the beam turning mirrors 109a and 109b may be formed using a polymer material or the like. As shown in FIG. 5, such a configuration may be possible in which in the portion of the optical waveguide optically connected to the optical interconnection module, the waveguide core 110b of the optical waveguide optically connected to the modulator device 102 and the waveguide core 110a of the optical waveguide optically connected to the photo diode 103 are formed in different layers.

As this configuration, the optical interconnection module having the modulator device 102, the photo diode 103, the driver circuit 104, and the transimpedance amplifier 115 monolithic integrated on a single Si (silicon) chip is mounted on the substrate provided with the optical waveguide having a beam turning mirror structure. Thus, it is possible to implement a high-speed, large-capacity optical-electrical hybrid board in which signals sent and received between the diodes and the optical waveguide are highly efficiently optically connected to each other through the Si substrate.

Sixth Embodiment

Figure 6:
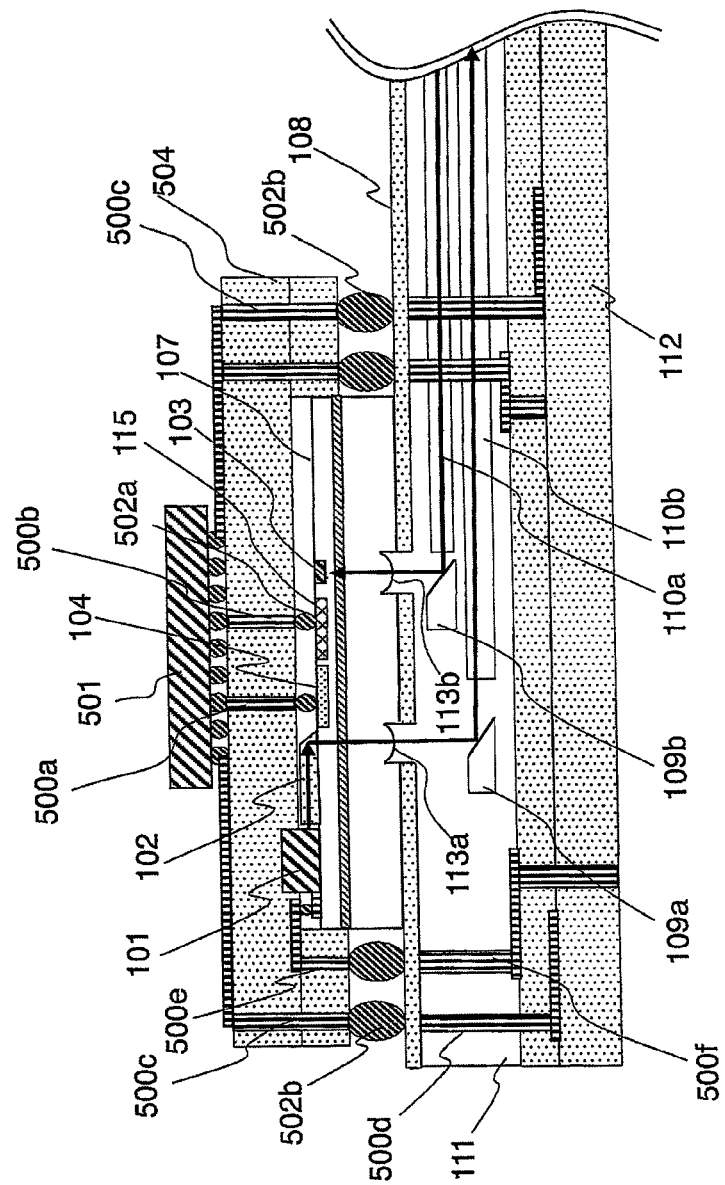
FIG. 6 is a cross sectional view illustrating an optical-electrical hybrid board according to a sixth embodiment of the present invention on which an optical interconnection module is mounted.
Figure 7:
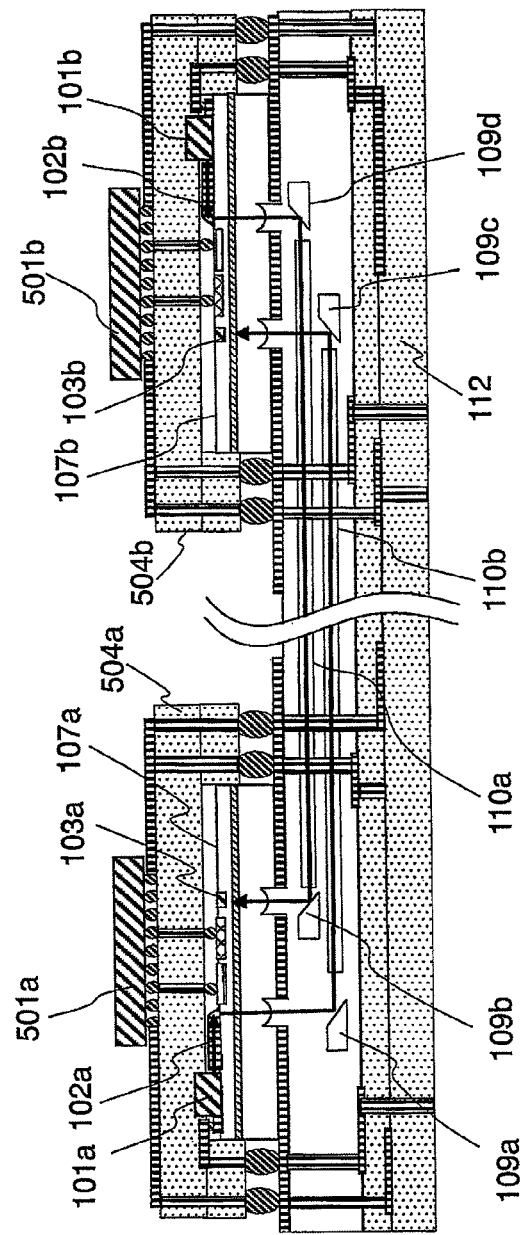
FIG. 7 is a cross sectional view illustrating an optical-electrical hybrid board according to the sixth embodiment of the present invention on which a first and second optical interconnection module are mounted.

FIGS. 6 and 7 are cross sectional views illustrating an optical-electrical hybrid board according to a sixth embodiment of the present invention on which an optical interconnection module is mounted. In this embodiment, as shown in FIG. 6, an interposer substrate 504 having electric via holes 500a, 500b, and 500c is provided directly above an optical interconnection module 107. An LSI 501 for switching, logic, or the like is placed on the interposer substrate 504.

According to this configuration, high-frequency signals sent and received between the LSI 501 and a modulator device 102, a photo diode 103, or a driver circuit 104 and between the LSI 501 and a trans impedance amplifier 115 are electrically connected through the via holes 500a and 500b in the interposer substrate 504, the modulator device 102, the photo diode 103, the driver circuit 104, and the trans impedance amplifier 115 being integrated on the optical interconnection module 107. The bias of a laser optical source device 101 integrated on the optical interconnection module 107 is supplied through a via hole 500e of the interposer substrate 504 and a via hole 500f formed on an optical waveguide wiring board. Similarly, such a configuration is provided in which the bias or GND for the LSI 501 is supplied through the via hole 500c of the interposer substrate 504 or a via hole 500d formed on the optical waveguide wiring board.

With this configuration, the direction of emitting optical signals from the modulator device 102 and the high-frequency wiring via hole 500a between the driver circuit 104 and the LSI 501 are vertically separated from each other. Thus, it is possible to three-dimensionally mount the optical module in high density, it is possible to bring the optical interconnection module 107 close to the optical waveguide with no separation of electric wiring portions by wire bonding, and it is possible to highly efficiently optically connect the optical interconnection module 107 to the optical waveguide. The bias wiring of the laser optical source device 101 is routed on the interposer substrate 504 on the rear side of the device. Thus, it is possible to separate the high-frequency wiring (via hole) 500a from the bias wiring (via hole) 500e of the laser optical source device 101, it is possible to suppress the leakage of high-frequency signals from the high-frequency wiring (via hole) 500a to the bias wiring, and it is possible to separate heat generated from the LSI 501 from the self-heating path of the laser optical source device 101.

FIG. 7 shows an example of mounting an optical-electrical hybrid board in a form in which a first optical interconnection module 107a having an interposer substrate 504a and an LSI 501a mounted thereon and a second optical interconnection module 107b having an interposer substrate 504b and an LSI 501b mounted thereon are mounted on an optical waveguide wiring board having wiring cores 110a and 110b and beam tuning mirrors 109a, 109b, 109c, and 109d in two layers.

With this configuration, it is possible to implement high-speed, large-capacity signal transmission in transmitting and receiving signals between chips mounted on a board.

What is claimed is:

1. A method of manufacturing an optical interconnection module, comprising the steps (1) to (8):
    (1) providing a silicon semiconductor substrate having a front surface, the silicon semiconductor substrate including a silicon semiconductor layer and a silicon oxide layer, the silicon oxide layer being formed between the silicon semiconductor layer and the front surface of the silicon semiconductor substrate;
    (2) depositing a modulator material layer on the front surface of the silicon semiconductor substrate;
    (3) using silicon wafer processing, patterning the modulator material layer to form a silicon waveguide modulator device portion at the front surface of the silicon semiconductor substrate, wherein an optical output from a laser-diode device is optically connected to an optical input terminal of the modulator device portion;
    (4) forming a photodiode on the substrate and a driver IC on the front surface of the silicon semiconductor substrate to be juxtaposed between the modulator device portion and the photodiode;
    (5) forming, using the silicon wafer processing, a tapered part on one end of the modulator device portion so as to provide a beam turning portion on the modulator device portion;
    (6) forming a bias power supply line for driving the optical source device on the front surface of the silicon semiconductor substrate; and
    (7) forming high-frequency electric lines on the silicon semiconductor substrate connecting the photodiode and the modulator device portion with the driver IC, respectively,
    wherein the modulator device portion is monolithically formed and integrated onto the front surface of the silicon semiconductor substrate.

2. The method of manufacturing an optical interconnection module according to claim 1,
    wherein the driver IC includes a driver circuit which drives the modulator device portion and a trans impedance amplifier which amplifies an electric signal outputted from the photodiode, and
    wherein the driver IC is arranged between the modulator device portion and the photodiode so as to face each of them on the silicon semiconductor substrate.

3. The method of manufacturing an optical interconnection module according to claim 1,
    wherein the bias power supply line is extended in a first direction and one of the high-frequency electric lines connected to the modulator device portion is extended in a second direction opposite to the first direction.

4. The method of manufacturing an optical interconnection module according to claim 1,
    wherein the modulator device portion is composed of any material of silicon film, silicon oxide film, and silicon nitride film.

5. The method of manufacturing an optical interconnection module according to claim 1,
    wherein the beam turning portion provides a structure such that light propagating in a direction parallel to a main surface of the silicon semiconductor substrate is bent in a direction substantially perpendicular to the main surface of the silicon semiconductor substrate.

6. The method of manufacturing an optical interconnection module according to claim 5,
    wherein the beam turning portion has an angle in a range of 35 to 55 degrees.

7. The method of manufacturing an optical interconnection module according to claim 1,
    wherein each of the driver IC and the photodiode comprises a diffusion layer formed in the silicon semiconductor substrate.

8. The method of manufacturing an optical interconnection module according to claim 1,
    wherein each of the driver IC and the photodiode is formed by a process including patterning a film deposited on the silicon semiconductor substrate.

9. The method of manufacturing an optical interconnection module according to claim 1,
    wherein the photodiode is formed using epitaxial growth of germanium material.

10. The method of manufacturing an optical interconnection module according to claim 1,
    wherein the photodiode and the driver IC are monolithically formed and integrated onto the front surface of the silicon semiconductor substrate.

11. The method of manufacturing an optical interconnection module according to claim 1,
    wherein the silicon semiconductor substrate is an SOI substrate.

* * * * *